United States Patent [19]
Kamashita

[11] Patent Number: 6,091,793
[45] Date of Patent: Jul. 18, 2000

[54] SOLID-STATE PHOTOGRAPHIC DEVICE HAVING A CHARGE STORAGE ELEMENT FOR SIMULTANEOUS SHUTTER ACTION

[75] Inventor: Atsushi Kamashita, Kawasaki, Japan

[73] Assignee: Nikon Corporation, Japan

[21] Appl. No.: 09/204,625

[22] Filed: Dec. 1, 1998

[30] Foreign Application Priority Data

Dec. 5, 1997 [JP] Japan .................................. 9-350163

[51] Int. Cl.$^7$ .................................................. G11C 19/28
[52] U.S. Cl. ............................ 377/60; 257/258; 257/292
[58] Field of Search ................................ 257/235, 239, 257/291, 292, 257, 258; 377/60; 327/514

[56] References Cited

U.S. PATENT DOCUMENTS

| | | | |
|---|---|---|---|
| 4,980,735 | 12/1990 | Yamawaki | 257/292 |
| 5,563,429 | 10/1996 | Isogai | 257/292 |
| 5,625,210 | 4/1997 | Lee et al. | 257/292 |
| 5,847,381 | 12/1998 | Isogai | 257/292 |
| 5,898,196 | 4/1999 | Hook et al. | 257/292 |
| 5,903,021 | 5/1999 | Lee et al. | 257/292 |
| 5,942,774 | 8/1999 | Isogai et al. | 257/292 |
| 5,977,576 | 11/1999 | Hamasaki | 257/292 |

*Primary Examiner*—Gene M. Munson
*Attorney, Agent, or Firm*—Ipsolon LLP

[57] ABSTRACT

A solid-state photographic element that can perform electronic shutter action simultaneously for all pixels is disclosed. Each pixel includes a photoelectric converter (such as a photodiode), a first transfer gate, a charge storage element, a second transfer gate, an amplifier, and a reset element. All photodiodes are first reset, then the first transfer gates selected OFF at the same time and charges accumulate in all photodiodes simultaneously. After a predetermined shutter time has elapsed, the first transfer gates are selected ON at the same time and charges that accumulated in the photodiodes are transferred to the corresponding charge storage elements. Thereafter, first transfer gates are selected OFF. A vertical scanning circuit may then select second transfer gates ON sequentially for each row, so that charges accumulated in the charge storage elements are transferred to control regions of corresponding amplifiers. Charges, amplified by the amplifiers, are then stored in light signal output capacitors. Charges stored in light signal output capacitors are read as video signals by column by outputting from a horizontal scanning circuit.

24 Claims, 5 Drawing Sheets

SOLID-STATE PHOTOGRAPHIC DEVICE HAVING A CHARGE STORAGE ELEMENT FOR SIMULTANEOUS SHUTTER ACTION

BACKGROUND OF THE INVENTION

1. Field of the Invention

The present invention pertains to a solid-state photographic element having a plurality of pixels. More particularly, this invention pertains to a solid-state photographic element that can perform electronic shutter action simultaneously for a plurality of pixels.

2. Description of the Related Art

To increase the sensitivity of solid-state photographic elements, a signal amplification, junction field-effect transistor (JFET) may be installed in pixel units in the photographic elements. These are called amplification type solid-state photographic elements. A prior art photographic element includes a photoelectric converter separated from the amplifying transistor and a transfer gate, located between the photoelectric converter and the transistor, that controls transfer of charges (i.e., potential) from the photoelectric converter to the amplifying transistor.

FIG. 6 is a schematic circuit diagram of a prior art amplification type solid-state photographic element. FIG. 7 is a pulse timing chart that illustrates the operation of the schematic circuit diagram shown in FIG. 6.

As shown in FIG. 6, each pixel 31 (only one of nine shown pixels is labeled with reference numbers) is comprised of a transfer control element (a p-channel MOSFET) 31$a$, a photodiode 1 that generates and accumulates a charge according to incident light, and a JFET 2 that generates a signal output according to the charge received at its control region (the gate). The transfer control element 31$a$ includes a transfer gate electrode TG for controlling transfer of the charge generated and accumulated by photodiode 1 to the control region of JFET 2. A reset element (p-channel MOSFET) 31$b$ having a reset drain $R_D$, is provided for discharging the charge transmitted to the control region of JFET 2. Reset gate $R_G$ is a reset control for controlling reset drain $R_D$.

The source of each JFET 2 is connected in common to vertical source lines 32$a$, 32$b$, and 32$c$ for each column of the matrix layout. A common drain power source 31$c$ for the all pixels is connected to the drain of each JFET and the cathode side of photodiode 1 by a pattern, or diffusion, layer not represented in the figure. In addition, the control region (gate) of JFET 2 is connected to the drain of transfer control element 31$a$ and the anode side of each photodiode 1 is connected to the source of element 31$a$.

Transfer gates (transfer gate electrodes) $T_G$ of transfer control elements 31$a$ are connected in common to respective clock lines 33$a$, 33$b$, and 33$c$ that scan under control of a vertical scanning circuit 34 for each row of the matrix layout. When drive pulses $\phi_{TG1}$ to $\phi_{TG3}$ are delivered from vertical scanning circuit 34, transfer control elements 31$a$ operate in sequence for each row of pixels.

The reset drains $R_D$ of the reset elements 31$b$ are connected in common to clock lines 50$a$, 50$b$, and 50$c$ that scan under control of the vertical scanning circuit 34 for each row of the matrix layout. Reset gates (reset gate electrodes) $R_G$ are connected in common for all pixels to drive pulse generating circuit 37 by way of row line 37$a$. In addition, the source of reset element 31$b$ is the same as the drain of transfer control element 31$a$. Moreover, this is designed such that this reset element 31$b$ operates when drive pulse $\phi_{RG}$ delivered from drive pulse generating circuit 37 is applied to the reset gates $R_G$.

Each of vertical source lines 32$a$, 32$b$, and 32$c$ is connected to the electrodes of each of light signal output accumulating capacitors (second memory elements) $C_{S1}$, $C_{S2}$, and $C_{S3}$ by way of light signal output transmitting MOS transistors $T_{S1}$, $T_{S2}$, and $T_{S3}$, and to dark signal accumulating capacitors (first memory elements) $C_{D1}$, $C_{D2}$, and $C_{D3}$ by way of dark output transmitting MOS transistors $T_{D1}$, $T_{D2}$, and $T_{D3}$. Respectively, the MOS transistors $T_{S1}$, $T_{S2}$, and $T_{S3}$ and second memory elements $C_{S1}$, $C_{S2}$, and $C_{S3}$, and MOS transistors $T_{D1}$, $T_{D2}$, and $T_{D3}$ and first memory elements $C_{D1}$, $C_{D2}$, and $C_{D3}$ are connected to signal output line 38 and dark output line 39 via horizontal read select MOS transistors $T_{HS1}$, $T_{HS2}$, $T_{HS3}$, $T_{HD1}$, $T_{HD2}$, and $T_{HD3}$. Moreover, generally, parasitic capacitors $C_{HS}$ and $C_{HD}$ are present on signal output line 38 and dark output line 39, respectively. In addition, buffer amplifiers 38$a$ and 39$a$ are connected to signal output line 38 and dark output line 39, respectively.

Signal output line 38 and dark output line 39 are also connected to the drains of horizontal read reset MOS transistors $T_{RHS}$ and $T_{RHD}$ for resetting the video signal delivered. These horizontal read reset MOS transistors $T_{RHS}$ and $T_{RHD}$ are connected to the electrodes of the above-mentioned light signal output accumulating capacitors $C_{S1}$, $C_{S2}$, and $C_{S3}$ and dark signal accumulating capacitors $C_{D1}$, $C_{D2}$, and $C_{D3}$, and then to the ground (GND). Horizontal read reset MOS transistors $T_{HRS}$ and $T_{HRD}$ operate when drive pulse $\phi_{RH}$, delivered from drive pulse generating circuit 43, is applied to the gate electrodes of these horizontal read reset MOS transistors $T_{HRS}$ and $T_{HRD}$.

Horizontal select signal lines 40$a$, 40$b$, and 40$c$ are connected to horizontal scanning circuit 40 and are connected in common for each column to each of the gate electrodes of the above-mentioned horizontal read select MOS transistors $T_{HS1}$, $T_{HS2}$, $T_{HS3}$, $T_{HD1}$, $T_{HD2}$, and $T_{HD3}$, and are designed such that horizontal reading is controlled by drive pulses $\phi_{H1}$ to $\phi_{H3}$ delivered from horizontal scanning circuit 40.

Each of the gate electrodes of the light signal output transmitting MOS transistors $T_{S1}$, $T_{S2}$ and $T_{S3}$ is connected to drive pulse generating circuit 41 by way of light signal clock line 41$a$, and each of the dark output transmitting MOS transistors $T_{D1}$, $T_{D2}$, and $T_{D3}$ is connected to drive pulse generating circuit 42 by way of dark output clock line 42$a$. These are designed such that when drive pulse $\phi_{TS}$ or $\phi_{TD}$ delivered from drive pulse generating circuits 41 or 42 is applied, light signal output transmitting MOS transistors $T_{S1}$, $T_{S2}$, and $T_{S3}$ or dark output transmitting MOS transistors $T_{D1}$, $T_{D2}$, and $T_{D3}$ operate in a predetermined sequence.

The vertical source lines 32$a$, 32$b$, and 32$c$ are connected to the drains of reset transistors $T_{RV1}$, $T_{RV2}$, and $T_{RV3}$ and to source-follower read constant-current sources 44$a$, 44$b$, and 44$c$. In addition, source voltage $V_{RV}$ (e.g., $V_{RV}$=GND) is supplied to the sources of each reset transistor $T_{RV1}$, $T_{RV2}$, and $T_{RV3}$, and source voltage $V_{CS}$ is supplied to constant-current sources 44$a$, 44$b$, and 44$c$.

Moreover, when reset pulse $\phi_{RV}$ is supplied to the gate electrodes of reset transistors $T_{RV1}$, $T_{RV2}$, and $T_{RV3}$ and this reset pulse $\phi_{RV}$ is high level, vertical source lines 32$a$, 32$b$, and 32$c$ can be conducted through reset transistors $T_{RV1}$, $T_{RV2}$, and $T_{RV3}$ to ground ($V_{RV}$=GND).

In addition, constant-current sources 44$a$, 44$b$, and 44$c$ are designed such that by suppressing time function discrepancies due to factors such as fluctuation in the bias point for each pixel 31 at the same time that they control the time function of source follower operation, gain is systematized and fixed pattern noise (FPN) is suppressed.

Next, the operation of a photoelectric converter is explained while referring to the pulse timing chart shown in FIG. 7. The operation of reading the first row of pixels 31 is performed in the interval from $t_{11}$ to $t_{15}$ (the first digit of the subscript refers to the row undergoing operations). The operations of reading the second row and third rows of pixels are performed during the intervals from $t_{21}$ to $t_{25}$ and from $t_{31}$ to $t_{35}$, respectively.

In addition, each of $t_{11}$ to $t_{14}$ correspond as follows: $t_{11}$ to the initializing operation of the JFETs 2, $t_{12}$ to the source-follower operation of JFETs 2 after initializing, $t_{13}$ to the operation of transmitting a signal charge from first row photodiodes 1 to JFETs 2, and $t_{14}$ to the source-follower operation of JFETs 2 after transmitting. These four operations are performed during the horizontal blanking interval. Furthermore, $t_{15}$ is the video signal output interval.

First, as shown in FIG. 7, at the start of interval $t_{11}$, drive pulse $\phi_{RD1}$ is set to high level (with drive pulses $\phi_{RD2}$ and $\phi_{RD3}$ still at low level), to apply a voltage drive pulse to the reset drains $R_D$ of the first row of pixels 31. Because the reset gate $R_G$ is ON (i.e., reset element 31b is p-type and $\phi_{RG}$ is at a low level) and a high level voltage is applied to the reset drains $R_D$, each first row JFET 2 is selected (ON). In addition, because the reset gates $R_G$ of all pixels 31 are already conducting (ON), a low-level voltage is transmitted to the control region of the JFETs 2 of the second and third row of pixels 31, the control regions of these JFETs 2 are initialized, and each second and third row JFET 2 is not selected (OFF).

By delivering voltage drive pulses ($\phi_{RD1}$, $\phi_{RD2}$, and $\phi_{RD3}$) to reset drains $R_D$, JFETs 2 are selected (ON) or not selected (OFF), because the control regions of JFET 2 in selected rows are initialized at high-level potential and the control regions of JFET 2 in non-selected rows are initialized at low-level potential.

In addition, at the end of interval $t_{11}$ (the start of interval $t_{12}$), by setting drive pulse $\phi_{RG}$ to high level to make reset gate $R_G$ non-conducting (OFF), the control region of each JFET 2 is maintained at their selected (ON) or non-selected (OFF) state.

At the same time (the start of interval $t_{12}$), by setting drive pulse $\phi_{RV}$ to low level, reset transistors $T_{RV1}$ to $T_{RV3}$ are intercepted (OFF). As a result, each first row JFET 2 performs source-follower operation during this interval $t_{12}$.

Moreover, during this interval $t_{12}$, by setting drive pulse $\phi_{TD}$ to high level, dark output transmitting MOS transistors $T_{D1}$, $T_{D2}$, and $T_{D3}$ become conducting (ON), and output (dark output) voltages corresponding to the potential in the control region of each JFET 2 immediately after initializing are accumulated in dark signal accumulating capacitors $C_{D1}$, $C_{D2}$, and $C_{D3}$.

During interval $t_{13}$, by setting drive pulse $\phi_{TG1}$ to low level, p-type transfer gate $T_G$ is changed from non-conducting (OFF) to conducting (ON), and by setting drive pulse $\phi_{TS}$ to high level and drive pulse $\phi_{TD}$ to low level, light signal output transmitting MOS transistors $T_{S1}$, $T_{S2}$, and $T_{S3}$ become conducting (ON) and dark output transmitting MOS transistors $T_{D1}$, $T_{D2}$, and $T_{D3}$ become non-conducting (OFF).

As a result, the charges generated and accumulated by the first row photodiodes 1 are transferred to the control regions of JFETs 2. Moreover, the potential in the control region of JFET 2 after this charge is transferred is changed (in this case, increased) by exactly the charge amount divided by gate capacitance. In addition, in FIG. 7, the reason why transfer gate TG becomes conducting (ON) when drive pulse $\phi_{TG1}$ is low level is because transfer control element 31a is p-channel type and has the opposite polarity from the other drive pulses.

During interval $t_{14}$, as in interval $t_{12}$, by setting drive pulse $\phi_{TG1}$ to high level, first row transfer gates TG become non-conducting (OFF) and the charge photoelectrically converted by photodiode 1 is accumulated, and by setting drive pulse $\phi_{RV}$ to low level, reset transistors $T_{RV1}$ to $T_{RV3}$ are intercepted (OFF). As a result, each first row JFET 2 performs source-follower operation.

Moreover, during this interval $t_{14}$, because drive pulse $\phi_{TS}$ is high level, light signal output transmitting MOS transistors $T_{S1}$, $T_{S2}$, and $T_{S3}$ become conducting (ON), and output (signal output) voltages corresponding to the potential in the control region of each JFET 2 after charge has been transmitted are accumulated in light signal output accumulating capacitors $C_{S1}$, $C_{S2}$, and $C_{S3}$.

During interval $t_{15}$, by setting each of drive pulses $\phi_{RD1}$, $\phi_{RG}$, and $\phi_{TS}$ to low level and by setting drive pulse $\phi_{RV}$ to high level, output voltages accumulated in light signal output accumulating capacitors $C_{S1}$ to $C_{S3}$ and dark signal accumulating capacitors $C_{D1}$ to $C_{D3}$ are prepared for output as described below.

In addition, by outputting drive pulses $\phi_{H1}$ to $\phi_{H3}$ from horizontal scanning circuit 40 and drive pulse $\phi_{RH}$ from drive pulse generating circuit 43 in sequence, signals accumulated in light signal output accumulating capacitors $C_{S1}$ to $C_{S3}$ and dark signal accumulating capacitors $C_{D1}$ to $C_{D3}$ are read by the horizontal read lines of signal output line 38 and dark output line 39, respectively. As signals are output, they are read horizontally by signal output line 38 and dark output line 39, then the horizontal read line is reset.

Moreover, signals obtained from output terminals $V_{OS}$ and $V_{OD}$ are subjected to computation processing by an external computation circuit not shown in the figure. Because the signal obtained from output terminal $V_{OS}$ contains a signal component (S) and a dark component (D) and the signal obtained from output terminal $V_{OD}$ contains only a dark component (D), by subjecting signals obtained from output terminals $V_{OS}$ and $V_{OD}$ to computation processing (subtraction processing ($V_{OS}-V_{OD}$)), a dark signal corresponding to only the signal component (S) is extracted.

First row reading operating corresponding to interval $t_{11}$ to $t_{15}$ described above is repeated in the same way for the second and third rows during the interval from $t_{21}$ to $t_{25}$ and the interval from $t_{31}$ to $t_{35}$.

However, a solid-state photographic element such as shown in FIG. 6 can not perform electronic shutter action simultaneously for all pixels. To perform electronic shutter action simultaneously for all pixels, photoelectric converters must be reset simultaneously for all pixels and signal charges accumulated by photoelectric converters simultaneously for all pixels must be transmitted to amplifiers simultaneously for all pixels.

However, in prior art solid-state photographic elements, a charge accumulated by a photoelectric converter (buried photodiode) is transmitted to an amplifier (JFET 2) for each row sequentially and cannot be transmitted simultaneously in all pixels. If prior art elements where set to transfer the charge simultaneously in all pixels no video signal would result because the amplifiers (JFET 2) of all pixels would be ON simultaneously and signals to light signal accumulating capacitors or dark output accumulating capacitors would be accumulated simultaneously for all pixels. To provide a video signal it is necessary to read the charges sequentially.

SUMMARY OF THE INVENTION

The present invention provides an amplification type solid-state photographic element that can perform electronic shutter operation simultaneously for all pixels, reduce dark current and latent images, and be assembled in a large scale integrated circuit (LSI), to obtain an LSI that has high source-follower operation gain, and to greatly reduce dark current caused by surface states.

The present invention locates within a pixel a charge storage element between a photoelectric converter and an amplifier that temporarily stores charges from the photoelectric converter. A first transfer gate is located between the photoelectric converter and the charge storage element and a second transfer gate is located between the amplifier and the charge storage element to control the transfer of charges from the photoelectric converter to the charge storage element and to the amplifier.

Thus, a solid-state photographic element of the present invention provides a unit pixel having a photoelectric converter that generates and accumulates a charge according to incident light. An amplifier is provided that generates an output signal according to a charge potential received from the photoelectric converter at a control region of the amplifier. The charge storage element is located between the amplifier and the photoelectric converter to temporary store the charge. A first transfer gate controls transfer of the charge from the photoelectric converter to the charge storage element and a second transfer gate controls transfer of the charge from the charge storage element to the control region of the amplifier. A reset element is provided to discharge the charge at the amplifier control region.

When a junction field effect transistor (JFET) is used as the amplifier, for example, the reset element may be a switching means for discharging the charge in the control region. If the amplifier is a MOSFET, the reset element may be a means that discharges the charge of the control region by directly controlling the control region.

In operation, the first transfer gates may be switched ON at the same time for all pixels and charges are transferred from the photoelectric converters to the charge storage elements simultaneously. The photoelectric converters are thus initialized simultaneously for all pixels. Charges transmitted to the charge storage elements are then transferred to the control region of the amplifiers by way of the second transfer gates, then further discharged to reset lines by the reset elements.

By switching first transfer gates ON, then OFF, at the same time for all pixels, charges start to accumulate in the photoelectric converters at the same time. The interval in which the first transfer gates are switched OFF corresponds to the exposure time. When first transfer gates are switched ON again at the same time, charges accumulated in the photoelectric converters during the exposure time are transferred to the charge storage elements at the same time. Then, by switching the first transfer gates OFF at the same time, the charges accumulated in the charge storage elements remain in the charge storage elements.

Thereafter, the second transfer gates are switched ON in sequence so that charges accumulated in the charge storage elements are delivered to the control region of the amplifiers in sequence in the same way as in the solid-state photographic element shown in FIG. 6. The subsequent operations of the solid-state photographic element are substantially the same as the operation of the solid-state photographic element shown in FIG. 6.

In preferred embodiments, the photoelectric converter is a buried photodiode having a buried region of a first conductive type that is buried in a semiconductor substrate of a second conductive type and a depletion prevention region that contacts the surface of the semiconductor substrate and is installed between the surface of the semiconductor substrate and the above-mentioned buried region. This embodiment of the photoelectric converter can reduce dark current and image lag.

Preferably, the second transfer gate is a MOS gate located between the amplifier and the charge storage element and the charge storage element is a diffusion region of the first conductive type on the surface of the semiconductor substrate between the second transfer gate and the photoelectric converter. The first transfer gate is a MOS gate located between the second transfer gate and the photoelectric converter, and covers the charge storage element. This embodiment further assists fabricating the solid-state photographic elements in an LSI, enabling high integration of solid-state photographic elements.

Preferably, the amplifier is a junction field effect transistor (JFET). permitting high source-follower operation gain. In addition, because signal charges in JFET control regions are not dissipated during the amplification operation such as in a bipolar transistor, noise can be reduced.

Preferably, when the first transfer gate (MOS gate) is OFF a switching voltage is of a level that forms an inversion layer on the surface of the charge storage element. According to this means, by filling the surface state of the charge storage element with electrons, this greatly reduces dark current caused by surface state.

DESCRIPTION OF THE PREFERRED EMBODIMENTS

Figure 1:
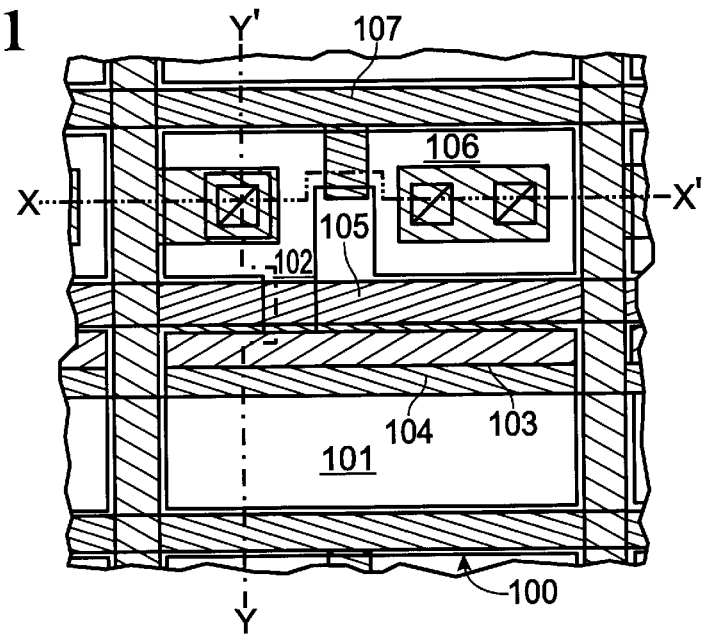
FIG. 1 is a plan view of one pixel of a solid-state photographic element of a preferred embodiment of the present invention.
Figure 2:
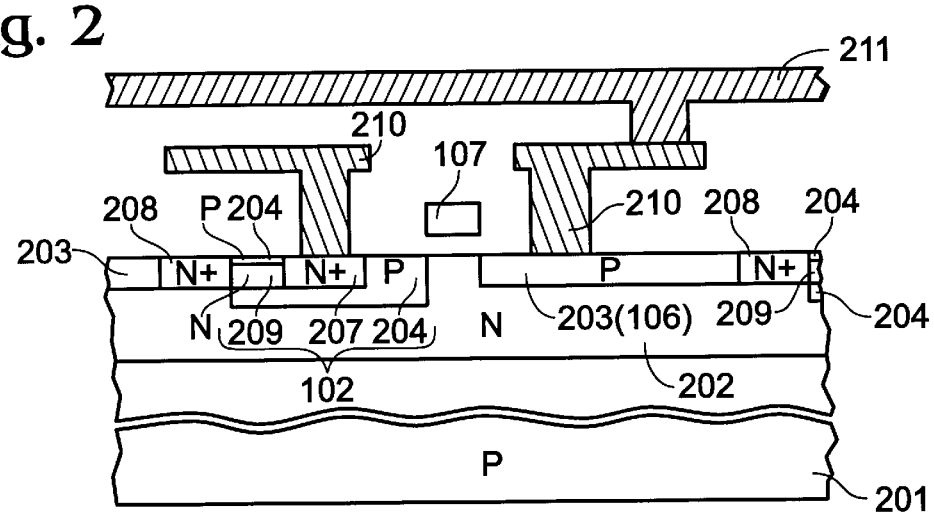
FIG. 2 is a section view taken along line X–X' in FIG. 1.
Figure 3:
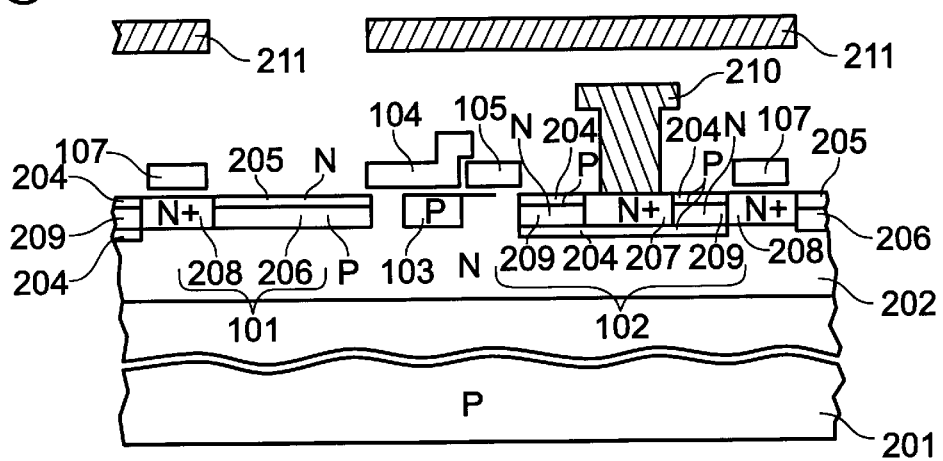
FIG. 3 is a section view taken along line Y–Y' in FIG. 1.

Preferred embodiments of the present invention are described below with reference to FIGS. 1–5. FIG. 1 is a plan view of one pixel 100 of a solid-state photographic element of the invention. FIG. 2 is a section view taken along line X–X' in FIG. 1 and FIG. 3 is a section view taken along line Y–Y'. The pixel 100 includes a buried photodiode (BPD) 101 that generates and accumulates a charge according to incident light and a junction field effect transistor (JFET) 102 that outputs a signal proportional to the charge, which charge is received at a control region 204 of the JFET. A charge storage element 103 is located between the BPD and the JFET and temporarily stores the charge (generated by the BPD 101) before the charge is transferred to the JFET 102. A first transfer gate ($T_{GA}$) 104 controls the transfer of the charge from the BPD to the charge storage element and a second transfer gate ($T_{GB}$) 105 controls transfer of the charge from the charge storage element to the JFET. A MOSFET structure having a reset drain ($R_D$) 106 and a reset gate ($R_G$) 107 is provided for discharging the charge transmitted to the control region of JFET 102.

N-type well 202 is installed on p-type silicon substrate 201 (FIGS. 2 and 3). In this well, BPD 101, JFET 102, and $R_D$ 106 are formed by ion injection or thermal diffusion of, for example, boron (B+) or phosphorus (P+), and first transfer gate ($T_{GA}$) 104, second transfer gate ($T_{GB}$) 105, and reset gate ($R_G$) 107 are formed by way of an insulating layer (not shown) by a method such as lithography.

As shown in FIG. 2, reset gate ($R_G$) 107 together with p-region 203 of reset drain ($R_D$) 106 and p-type gate region 204 of JFET 102 form a p-channel MOSFET.

In addition, as shown in FIG. 3, BPD 101 has an n-type surface layer 205, a p-type accumulation layer 206, an n-type well 202, and a p-type substrate 201, in this sequence from the surface to the reverse side of the semiconductor substrate, thus forming a buried photodiode that has a vertical overflow drain structure.

JFET 102 is comprised of an $n^+$-type source region 207, an $n^+$-type drain region 208, a p-type gate region (control region) 204, and an n-type channel region 209, and forms a structure in which p-type gate region (control region) 204 is above and below n-type channel 209.

Moreover, although not shown in FIG. 1 (to avoid covering the components discussed), pattern 211 (preferably an aluminum (Al) film) is attached to reset drain ($R_D$) 106 to serve as a light-shielding film (light-shielding Al) for shielding all parts of pixel 100 other than BPD 101 (FIGS. 2 and 3).

Charge storage element 103 is positioned in a p-type diffusion region formed on the surface of n-type well 201 between BPD 101 and JFET 102. The charge storage element temporarily stores the charge photoelectrically generated by BPD 101 before the charge is transferred to the control region 203 of JFET 102.

First transfer gate ($T_{GA}$) 104 is formed such that it covers charge storage element 103 and extends from the edge of BPD 101. Second transfer gate ($T_{GB}$) 105 forms a p-type MOSFET together with the p-type region of charge storage element 103 and the control region 204 of JFET 102. These first and second transfer gates 104,105 control charge transfer from the p-type region 206 of BPD 101 to the p-type charge storage element 103, and from the charge storage element 103 to p-type control region 204 of JFET 102.

Thus, when the first transfer gate 104 is set to low level (transfer gate 104 ON) and the second transfer gate 105 is set to high level (transfer gate 105 OFF), the potential of charge storage element 103 drops and the MOSFET that has p-type region 206 as source and p-type charge storage element 103 as drain is switched ON. As a result, the charge potential is transferred from BPD 101 to p-type charge storage element 103.

Next, when both first transfer gate 104 and second transfer gate 105 are set to high level, this switches the p-type MOSFETs formed by the two gates OFF. Therefore, the charge transmitted to p-type charge storage element 103 is stored within the charge storage element. At this time, an inversion layer is formed by applying a voltage of a size that inverts the surface of p-type charge storage element 103 to n-type (4 to 5 V, depending on the diffusion density of p-type charge storage element 103), and the surface state of p-type charge storage element 103 becomes filled with electrons. Therefore, even when a charge is held in p-type charge storage element 103 for a long time deterioration in image quality can be suppressed because there is little dark current.

Next, when first transfer gate 104 is set to high level and second transfer gate 105 is set to low level, the p-type MOSFET formed by the second transfer gate 105 is switched ON, and the charge in the charge storage element 103 is transferred to the p-type gate 204 (control region) of JFET 102.

Figure 4:
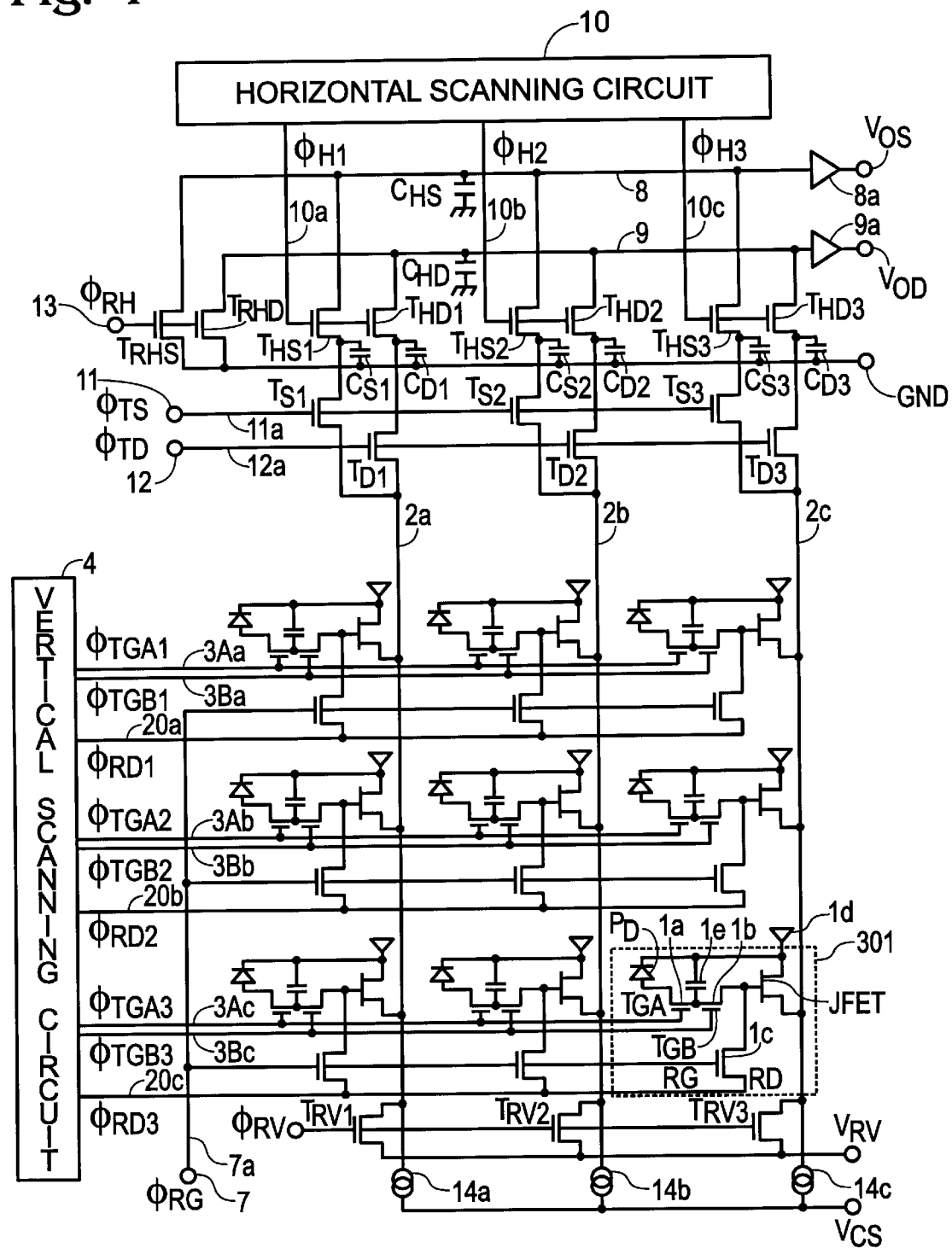
FIG. 4 is a schematic circuit diagram of a preferred embodiment of a solid-state photographic element of the present invention configured in a two-dimensional matrix of pixels.
Figure 5:
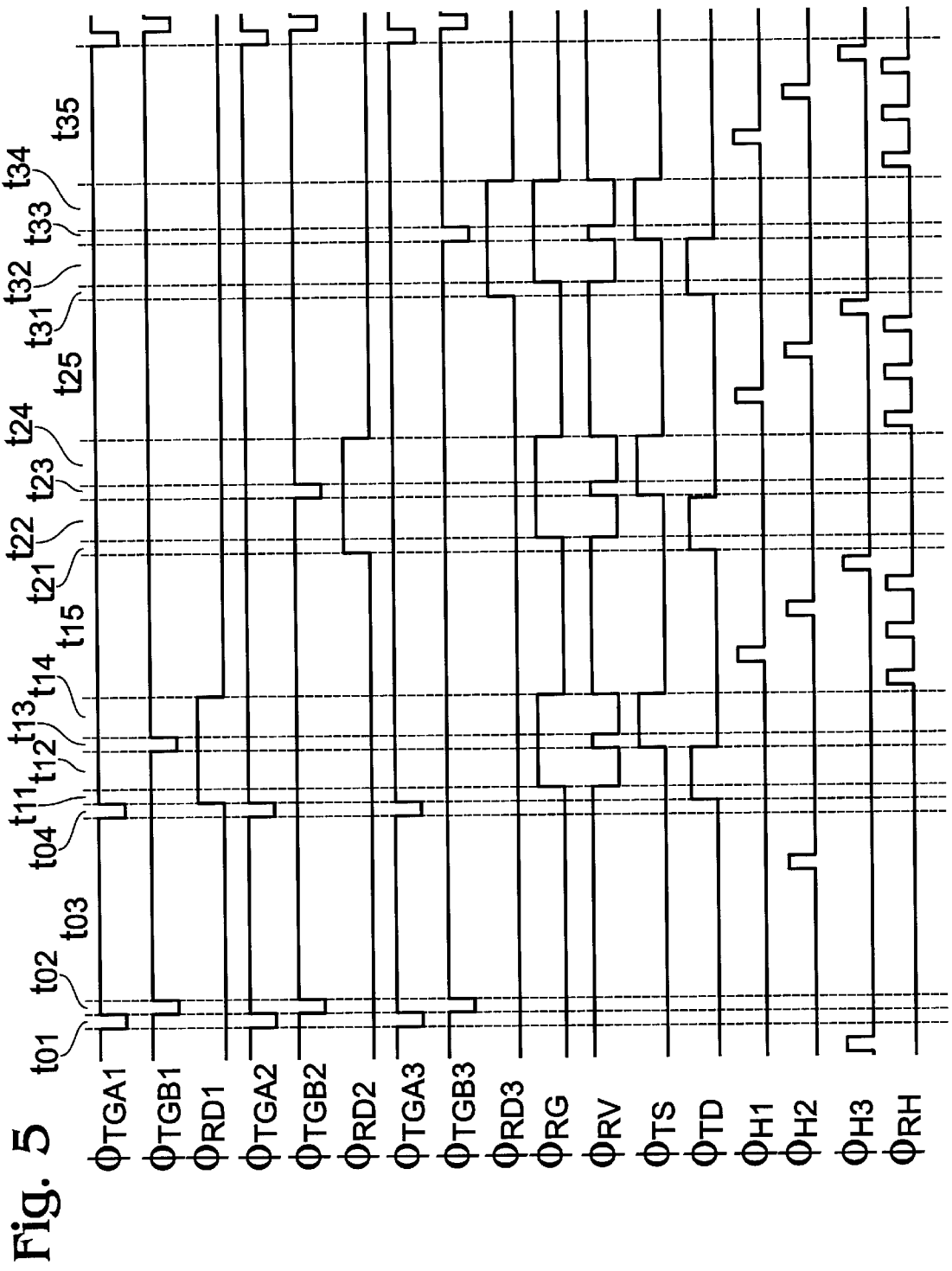
FIG. 5 is a pulse timing chart of the operation of the schematic circuit diagram of FIG. 4.
Figure 6:
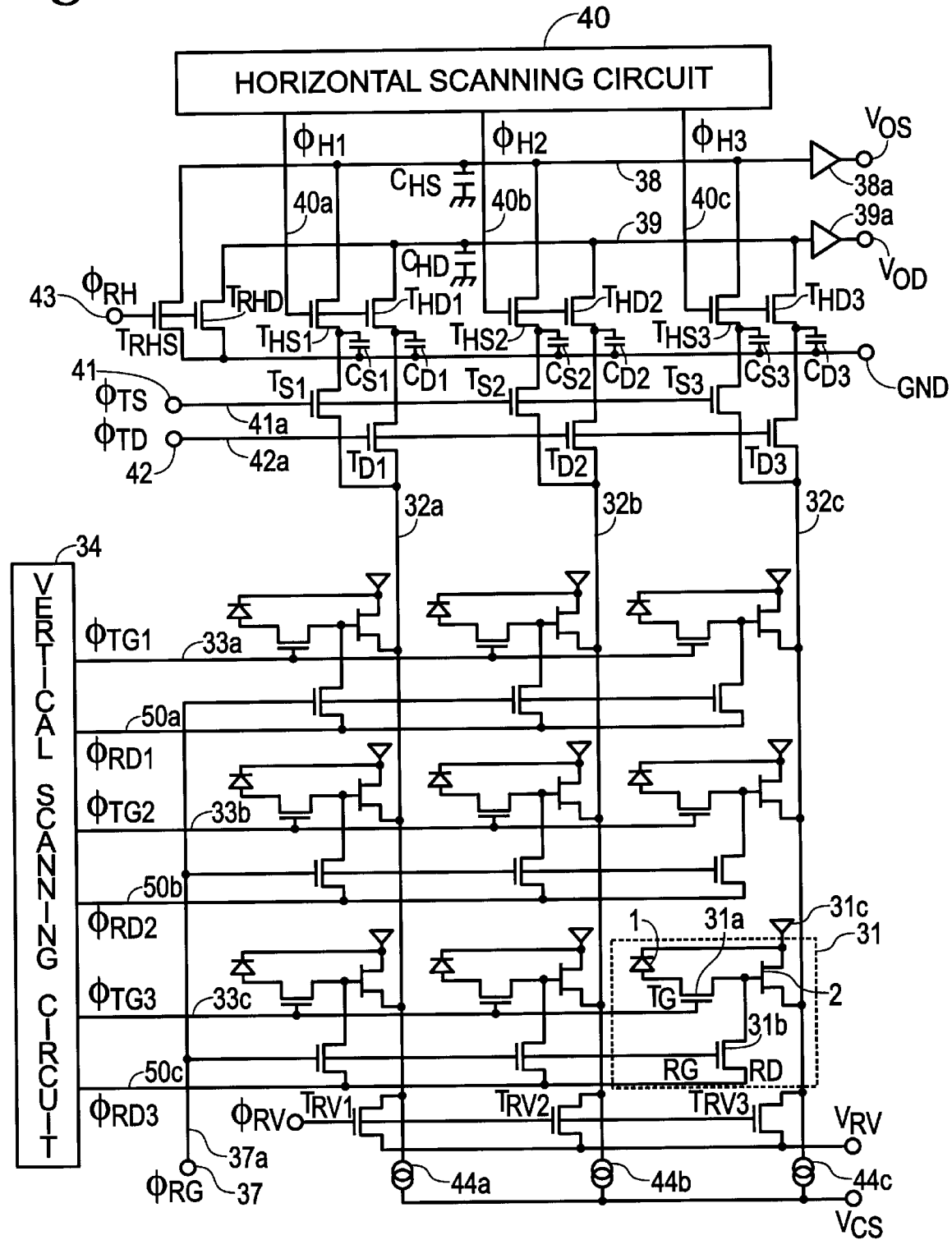
FIG. 6 is a schematic circuit diagram of a prior art solid-state photographic element.
Figure 7:
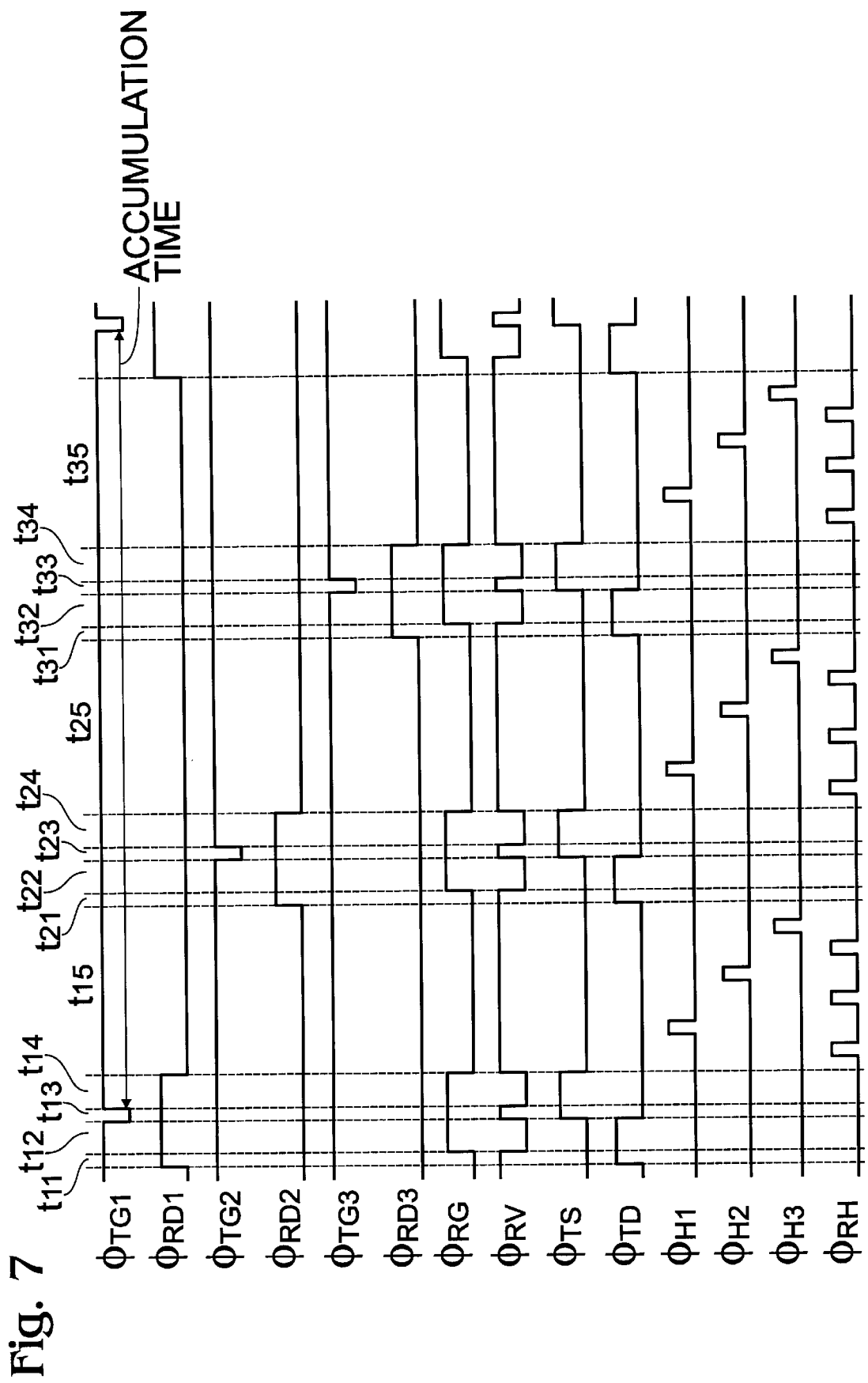
FIG. 7 is a pulse timing chart of the operation of the schematic circuit diagram of FIG. 6.

FIG. 4 is a schematic circuit diagram in which the unit pixel 100 shown of FIGS. 1 to 3 is represented as a circuit, along with additional circuitry to provide the pixel signal to output terminals for use in generating a photographic image. FIG. 5 is a pulse-timing chart that illustrates the operation of the schematic circuit diagram shown in FIG. 4.

The schematic of FIG. 4 represents an array, or matrix, of nine pixels arranged in three rows and three columns. To assist with the following description, a pixel in the third row, third column, is provided with reference numbers. All the pixels are identical.

A unit pixel 301 includes a photodiode $P_D$ that generates and accumulates a charge according to incident light on the pixel. A junction field effect transistor JFET receives the charge potential at its control region (gate) and generates an output signal that is proportional to the photodiode charge. A charge storage element 1e temporarily stores the charge transferred from the photodiode $P_D$ before the charge is transferred to the control region of the JFET. A first transfer control element 1a, having a first transfer gate $T_{GA}$, controls transfer of the charge from the photodiode $P_D$ to the charge storage element 1e and a second transfer control element 1b, having a second transfer gate $T_{GB}$, controls transfer of the charge from the charge storage element 1e to the control region of the JFET. A reset element 1c includes a reset drain $R_D$ for discharging the charge transferred to the control region of the JFET and a reset gate $R_G$ that controls switching of the element 1c and hence controls the timing of the discharge via reset drain $R_D$.

The source of each JFET is connected in common to vertical source lines 2a, 2b, and 2c for each column of the matrix layout. In addition, the drain of each JFET, and the cathode side of each photodiode $P_D$, are connected in common for all pixels by a pattern, or diffusion, layer (not shown in the figures), and are connected to power source voltage 1d. Furthermore, the anode side of each photodiode $P_D$ is connected to the source side of the first transfer control element 1a. The control region of each junction field effect transistor JFET is connected to the drain of the second transfer control element 1b.

First transfer gates $T_{GA}$ are connected in common to respective clock lines 3Aa, 3Ab, and 3Ac that scan under control of a vertical scanning circuit 4 for each row of the matrix layout. Vertical scanning operates in sequence for each row of pixels when drive pulses $\phi_{TGA1}$, $\phi_{TGA2}$, and $\phi_{TGA3}$ are provided by the vertical scanning circuit 4.

Likewise, the second transfer gates $T_{GB}$ are connected in common to respective clock lines 3Ba, 3Bb, and 3Bc that scan under the control of the vertical scanning circuit 4 for each row of the matrix layout. Again, vertical scanning operates in sequence for each row of pixels when drive pulses $\phi_{TGB1}$, $\phi_{TGB2}$, and $\phi_{TGB3}$ are provided by the vertical scanning circuit 4.

Reset element 1c is provided within each pixel 301. The reset drains $R_D$ are configured parallel to each row of pixels, and are connected in common to respective clock lines 20a, 20b, and 20c that scan under the control of the vertical scanning circuit 4 for each row of the matrix layout. The reset gates $R_G$ are connected in common for all pixels to drive pulse generating circuit 7 via a line 7a. In addition, the source of reset element 1c is common with the control region of junction field effect transistor JFET. The reset element 1c operates when a drive pulse $\phi_{RG}$ is provided from the drive pulse generating circuit 7 and applied to the reset gate $R_G$.

Each of the vertical source lines 2a, 2b, and 2c are connected to respective electrodes of light signal output accumulating capacitors $C_{S1}$, $C_{S2}$, and $C_{S3}$ by way of light signal output transmitting MOS transistors $T_{S1}$, $T_{S2}$, and $T_{S3}$, and to dark signal accumulating capacitors $C_{D1}$, $C_{D2}$, and $C_{D3}$ by way of dark output transmitting MOS transistors $T_{D1}$, $T_{D2}$, and $T_{D3}$. The accumulating capacitors $C_{S1}$, $C_{S2}$, $C_{S3}$, $C_{D1}$, $C_{D2}$, and $C_{D3}$ are connected to signal output line 8 and dark output line 9 through horizontal read select MOS transistors $T_{HS1}$, $T_{HS2}$, $T_{HS3}$, $T_{HD1}$, $T_{HD2}$, and $T_{HD3}$. Moreover, parasitic capacitors $C_{HS}$ and $C_{HD}$ are present on the signal output line 8 and dark output line 9, respectively. In addition, buffer amplifiers 8a and 9a are connected to signal output line 8 and dark output line 9, respectively.

The signal output line 8 and dark output line 9 are also connected to the drains of horizontal read reset MOS transistors $T_{HRS}$ and $T_{HRD}$ for resetting the video signal. The sources of the horizontal read reset MOS transistors $T_{HRS}$ and $T_{HRD}$ are connected to the light signal output accumulating capacitors $C_{S1}$, $C_{S2}$, and $C_{S3}$ and dark signal accumulating capacitors $C_{D1}$, $C_{D2}$, and $C_{D3}$, and then to the ground (GND). In addition, the horizontal read reset MOS transistors $T_{HRS}$ and $T_{HRD}$ operate when drive pulse $\phi_{RH}$, provided by a drive pulse generating circuit 13, is applied to their gate electrodes.

Horizontal select signal lines 10a, 10b, and 10c are connected to a horizontal scanning circuit 10 and are connected in common for each column to each of the gate electrodes of the horizontal read select MOS transistors $T_{HS1}$, $T_{HS2}$, $T_{HS3}$, $T_{HD1}$, $T_{HD2}$, and $T_{HD3}$. Horizontal reading is controlled by drive pulses $\phi_{H1}$ to $\phi_{H3}$ delivered from the horizontal scanning circuit 10 to the gate electrodes of the horizontal read select MOS transistors.

Each of the gate electrodes of the light signal output transmitting MOS transistors $T_{S1}$, $T_{S2}$, and $T_{S3}$ is connected to drive pulse generating circuit 11 by way of light signal clock line 11a. Each of the dark output transmitting MOS transistors $T_{D1}$, $T_{D2}$, and $T_{D3}$ is connected to drive pulse generating circuit 12 by way of dark output clock line 12a. When drive pulses $\phi_{TS}$ or $\phi_{TD}$, provided from the drive pulse generating circuits 11 or 12, are applied to the respective gate electrodes, the light signal output transmitting MOS transistors $T_{S1}$, $T_{S2}$, and $T_{S3}$ or dark output transmitting MOS transistors $T_{D1}$, $T_{D2}$, and $T_{D3}$ operate alternately in a predetermined sequence.

The vertical source lines 2a, 2b, and 2c are also connected to the drains of reset transistors $T_{RV1}$, $T_{RV2}$, and $T_{RV3}$ and to constant-current sources 14a, 14b, and 14c.

Moreover, when a vertical reset pulse $\phi_{RV}$ is supplied to the gate electrodes of reset transistors $T_{RV1}$, $T_{RV2}$, and $T_{RV3}$ and this reset pulse $\phi_{RV}$ is high level, the vertical source lines 2a, 2b, and 2c can be conducted through reset transistors $T_{RV1}$, $T_{RV2}$, and $T_{RV3}$ to ground ($V_{RV}$=GND). In addition, constant-current sources 14a, 14b, and 14c are designed such that by suppressing time function discrepancies due to factors such as fluctuation in the bias point for each pixel 301 at the same time that they control the time function of source follower operation, gain is systematized and fixed pattern noise (FPN) is suppressed.

Next, the operation of a solid-state photographic element according to this invention is explained while referring to the pulse timing chart shown in FIG. 5. The operation of resetting the photodiode and accumulating a signal charge in the photodiode and the operation of transferring the charge from the photodiode to the charge storage element occur during the interval from $t_{01}$ to $t_{04}$. Reading the first row of pixels 301 is performed during the interval from $t_{11}$ to $t_{15}$. And, reading the second row and third row of pixels is performed during the intervals from $t_{21}$ to $t_{25}$ and from $t_{31}$ to $t_{35}$, respectively.

Note that the time interval subscripts indicate the row of pixels and the operation that is being performed. The first subscript indicates which row of pixels are undergoing an operation during the time interval and the second subscript indicates the operation. The "0" subscript indicates operations performed on all rows of pixels.

The time intervals $t_{11}$ to $t_{14}$ correspond as follows: $t_{11}$ to the initializing operation of the JFETs, $t_{12}$ to the source-follower operation of the first row JFETs after initializing, $t_{13}$ to the operation of transferring the signal charges from the first row charge storage elements to the JFETs, and $t_{14}$ to the source-follower operation of the JFETs after charge transfer. Furthermore, $t_{15}$ is the video signal output interval. The time intervals of $t_{21}$ to $t_{25}$ and $t_{31}$ to $t_{35}$ relate to the same operations for the second and third rows, respectively.

First, as shown in FIG. 5, during time interval $t_{01}$, drive pulses $\phi_{TGA1}$, $\phi_{TGA2}$, and $\phi_{TGA3}$ are set to a low level thereby selecting ON the p-type transfer gates $T_{GA}$ so that the signal charges accumulated in photodiodes $P_D$ are transferred to charge storage elements 1e. Thus, all photodiodes $P_D$ are initialized simultaneously for all pixels (all rows, all columns). Next, during interval $t_{02}$, drive pulses $\phi_{TGA1}$, $\phi_{TGA2}$, and $\phi_{TGA3}$ are set to a high level (selecting transfer gates $T_{GA}$ OFF) and drive pulses $\phi_{TGB1}$, $\phi_{TGB2}$, and $\phi_{TGB3}$ are set to a low level (selecting transfer gates $T_{GB}$ ON) and the signal charges stored in charge storage elements 1e are transferred to the p-type gates of junction field effect transistors JFET, and the charge storage elements 1e are initialized.

At this time, drive pulse $\phi_{RG}$ is at a low level and applied to reset gates $R_G$. Because reset element 1c is a p-type MOSFET, it is switched ON. Therefore, the signal charges transmitted to the p-type gate of junction field effect transistor JFET are discharged through reset drain $R_D$.

In addition, when drive pulses $\phi_{TGA1}$, $\phi_{TGA2}$, and $\phi_{TGA3}$ are high level during time interval $t_{02}$, photodiodes $P_D$ simultaneously start to accumulate charges generated by photoelectric conversion.

Therefore, beginning at the start of interval $t_{02}$, (the end of interval $t_{01}$) when $\phi_{TGA1}$, $\phi_{TGA2}$, and $\phi_{TGA3}$ are at a high level and ending when $\phi_{TGA1}$, $\phi_{TGA2}$, and $\phi_{TGA3}$ are made low level at the end of interval $t_{03}$ (the start of interval $t_{04}$) is the charge accumulation time of photodiode $P_D$. Thus, charge accumulation time (shutter speed) can be set to the desired time by controlling the length of interval $t_{03}$. Next, during interval $t_{04}$, pulses $\phi_{TGA1}$, $\phi_{TGA2}$, and $\phi_{TGA3}$ are set to a low level and the signal charges accumulated in the photodiodes are transferred to the charge storage elements simultaneously for all pixels.

At the start of interval $t_{11}$, drive pulse $\phi_{RD1}$ is set to a high level (with drive pulses $\phi_{RD2}$ and $\phi_{RD3}$ maintained at a low level), and is applied to the reset drains $R_D$ of the first row of pixels. This operation causes the voltage to be transferred to the control region of each of the junction field effect transistors JFET of the first row of pixels and the junction field effect transistors JFET are selected (ON). The reset gates $R_G$ of all pixels are already ON because $\phi_{RG}$ is at a low level and reset elements 1e are p-type. Each second and subsequent row junction field effect transistor JFET is not selected (OFF) because $\phi_{RD2}$ and $\phi_{RD3}$ are maintained at a low level.

Delivering voltage drive pulses ($\phi_{RD1}$, $\phi_{RD2}$, and $\phi_{RD3}$) to reset drains $R_D$, junction field effect transistors JFET are selected (ON) or not selected (OFF), and the control regions of junction field effect transistors JFET in selected rows are initialized to the potential at reset drains $R_D$.

In addition, at the end of interval tag (the start of interval $t_{12}$), drive pulse $\phi_{RG}$ is set to a high level to make all reset gates $R_G$ non-conducting (OFF) and the control regions of each junction field effect transistor JFET are maintained at their respective selected (ON), or non-selected (OFF), states.

At the same time (the start of interval $t_{12}$), by setting drive pulse $\phi_{RV}$ to low level, reset transistors $T_{RV1}$ to $T_{RV3}$ are intercepted (OFF). As a result, each first row junction field effect transistor JFET performs source-follower operation during this interval $t_{12}$. Moreover, during this interval $t_{12}$, by setting drive pulse $\phi_{TD}$ to high level, dark output transmitting MOS transistors $T_{D1}$, $T_{D2}$, and $T_{D3}$ become conducting (ON), and output (dark output) voltages corresponding to the potential in the control region of each JFET immediately after initializing are accumulated in dark signal accumulating capacitors $C_{D1}$, $C_{D2}$, and $C_{D3}$.

During interval $t_{13}$, drive pulse $\phi_{TGB1}$ is set to a low level so that the first row transfer gates $T_{GB}$ are changed from non-conducting (OFF) to conducting (ON). Also, drive pulse $\phi_{TS}$ is set to a high level and drive pulse $\phi_{TD}$ is set to a low level so that light signal output transmitting MOS transistors $T_{S1}$, $T_{S2}$, and $T_{S3}$ become conducting (ON) and dark output transmitting MOS transistors $T_{D1}$, $T_{D2}$, and $T_{D3}$ become non-conducting (OFF).

As a result, the charges generated by first row photodiodes $P_D$ and stored in charge storage elements 1e are transferred to the control regions of junction field effect transistors JFET. Moreover, the potential in the control region of junction field effect transistor JFET after this charge is transferred is changed (in this case, increased) proportionately to the charge amount divided by gate capacitance. In addition, in FIG. 4, the reason why transfer gate $T_{GB}$ becomes conducting (ON) when drive pulse $\phi_{TGB1}$ is low level is because transfer control element 1a is p-channel type and has the opposite polarity from the other drive pulses.

During interval $t_{14}$, drive pulse $\phi_{TGB1}$ is set to a high level so that first row transfer gates $T_{GB}$ become non-conducting (OFF), and drive pulse $\phi_{RV}$ is set to a low level so that reset transistors $T_{RV1}$ to $T_{RV3}$ are intercepted (OFF). As a result, each first row JFET performs source-follower operation during time interval $t_{14}$.

Moreover, during time interval $t_{14}$, because drive pulse $\phi_{TS}$ is at a high level, light signal output transmitting MOS transistors $T_{S1}$, $T_{S2}$, and $T_{S3}$ are conducting (ON), and light signal output voltages (corresponding to the potential in the control region of each first row junction field effect transistor JFET) are accumulated in light signal output accumulating capacitors $C_{S1}$, $C_{S2}$, and $C_{S3}$.

During interval $t_{15}$, drive pulses $\phi_{RD1}$, $\phi_{RG}$, and $\phi_{TS}$ are set to a low level ($\phi_{TD}$ is held at a low level) and drive pulse $\phi_{RV}$ is set to a high level so that output voltages accumulated in light signal output accumulating capacitors $C_{S1}$ to $C_{S3}$ and dark signal accumulating capacitors $C_{D1}$ to $C_{D3}$ may be output as described below.

By outputting drive pulse $\phi_{RH}$ from drive pulse generating circuit 13 and drive pulses $\phi_{H1}$ to $\phi_{H3}$ from horizontal scanning circuit 10 in sequence, signals accumulated in light signal output accumulating capacitors $C_{S1}$ to $C_{S3}$ and dark signal accumulating capacitors $C_{D1}$ to $C_{D3}$ are read by the horizontal read lines of signal output line 8 and dark output line 9, respectively, and output to terminals $V_{OS}$ and $V_{OD}$. After each signal from each column is output from output terminals $V_{OS}$ and $V_{OD}$, the horizontal read line is reset by setting $\phi_{RH}$ to a low value between the sequential drive pulses $\phi_{H1}$, $\phi_{H2}$, and $\phi_{H3}$ so that the signal output line 8 and dark output line 9 are temporarily connected to GND through the horizontal reset transistors $T_{RHS}$ and $T_{HRD}$. Moreover, signals obtained from output terminals $V_{OS}$ and $V_{OD}$ are subjected to computation processing by an external computation circuit not shown in the figure. Because the signal obtained from output terminal $V_{OS}$ contains a light signal component (S) and a dark component (D) and the dark signal obtained from output terminal $V_{OD}$ contains only a dark component (D), by subjecting signals obtained from output terminals $V_{OS}$ and $V_{OD}$ to computation processing (subtraction processing ($V_{OS}-V_{OD}$)), a signal corresponding to only the light signal component (S) is extracted.

As described above, this invention can provide an all-pixel simultaneous electronic shutter. However, in the present embodiment, because photodiodes are reset during the signal charge read interval and the signal output interval, the simultaneous shutter action for all pixels is limited to still pictures.

In the example explained above, the reset operation is performed by discharging the charge accumulated in the photodiode to reset drain $R_D$ by way of the JFET control region. However, it also is possible to reset photodiodes by discharging the photodiode charge from the charge accumulation layer of the photodiode to the substrate by controlling the potential applied to the substrate. In this case, because photodiodes are reset regardless of the relationship between the charge reading part and the dark output part, it possible to achieve an all-pixel simultaneous electronic shutter for moving pictures.

Moreover, in the preferred embodiment described above, a junction field effect transistor JFET was used as the amplifier. However, a MOSFET also can be used as the amplifier.

EXAMPLE

A solid-state photographic element was manufactured having a structure as shown in FIGS. 1, 2, and 3 and described above.

Each pixel of the photographic element includes a buried photodiode (BPD) 101 that generates and accumulates a charge according to incident light, a junction field effect transistor (JFET) 102 that outputs a signal proportionate to the charge received at its control region, a charge storage element 103 that temporarily stores the charge generated and accumulated by the BPD before transmitting it to the JFET, a first transfer gate ($T_{GA}$) 104 that controls charge transfer from the BPD to the charge storage element, a second transfer gate ($T_{GB}$) 105 that controls charge transfer from the charge storage element 103 to the JFET, a reset drain ($R_D$) 106 for discharging the charge transferred to the control region of JFET 102, and a reset gate ($R_G$) 107 that controls the reset drain 106.

N-type well 202 with an impurity concentration of approximately $3 \times 10^{15}$ cm$^{-3}$ is installed on p-type silicon substrate 201 with an impurity concentration of approximately $4 \times 10^{14}$ cm$^{-3}$. In this well 202, BPD 101, JFET 102, and $R_D$ 106 are formed by ion injection or thermal diffusion of, for example, boron (B+) or phosphorus (P+), and first transfer gate $T_{GA}$ 104, second transfer gate $T_{GB}$ 105, and reset gate $R_G$ 107 are formed by way of an insulating layer (not shown) by a method such as lithography.

Reset gate $R_G$ 107 together with p-region 203 with an impurity concentration of approximately $5 \times 10^{18}$ cm$^{-3}$ of reset drain $R_D$ 106 and p-type gate region 204 of JFET 102 comprise a p-channel MOSFET.

Photodiode BPD 101 is comprised of a surface n-type layer 205 with an impurity concentration of approximately $2 \times 10^{17}$ cm$^{-3}$ and p-type charge accumulation layer 206 with an impurity concentration of approximately $3 \times 10^{16}$ cm$^{-3}$ together with an n-type well and a p-type substrate 201 in this sequence from the surface to the reverse side of the semiconductor substrate, and forms a buried photodiode that has a vertical overflow drain structure.

JFET 102 is comprised of n+-type source region 207 with an impurity concentration of approximately $2 \times 10^{20}$ cm$^{-3}$, n+-type drain region 208 with an impurity concentration of approximately $2 \times 10^{20}$ cm$^{-3}$, p-type gate region (control region) 204 with an impurity concentration of approximately $1 \times 10^{18}$ cm$^{-3}$, and n-type channel region 209 with an impurity concentration of approximately $1 \times 10^{17}$ cm$^{-3}$, and forms a structure in which p-type gate region 204 is on both sides of n-channel 209 above and below.

By applying a pulse voltage to reset gate $R_G$ 107, reset gate $R_G$ 107 and reset drain $R_D$ 106 initialize control region 204 of JFET 102 to the voltage of reset drain $R_D$ 106.

Moreover, although not shown in FIG. 1, as can be understood from FIGS. 2 and 3, metal pattern (aluminum (Al) film) 211 is attached to reset drain $R_D$ 106 to serve as a light-shielding film (light-shielding Al) for shielding all parts other than buried photodiode BPD 101.

Charge storage element 103 is positioned in a p-type diffusion region with an impurity concentration of approximately $2 \times 10^{16}$ cm$^{-3}$ formed on the surface of the n-type well between photodiode BPD 101 and JFET 102, and temporarily stores the charge photoelectrically generated by the photodiode BPD 101 before transferring it to the control region of JFET 102.

First transfer gate $T_{GA}$ 104 is formed such that it covers charge accumulation layer 103 from the edge of photodiode 101, and second transfer gate $T_{GB}$ 105 forms a p-type MOSFET together with the p-type region of charge accumulation layer 103 and p-type region 204 of the gate of JFET 102. These first and second transfer gates 104 and 105 control charge transfer of from p-type region 206 of buried photodiode (BPD) 101 to p-type charge storage element 103, and from charge storage element 103 to p-type gate 204 of JFET 102.

This specification sets forth the best mode for carrying out the invention as known at the time of filing the patent application and provides sufficient information to enable a person skilled in the art to make and use the invention. The specification further describes materials, shapes, configurations and arrangements of parts for making a using the invention. However, it is intended that the scope of the invention shall be limited by the language of the claims and the law of the land as pertains to valid U.S. patents.

What is claimed is:

1. A solid-state photographic element having a plurality of pixels, each pixel including a photoelectric converter that generates and accumulates a charge potential according to incident light, an amplifier having a control region in communication with the photoelectric converter wherein the amplifier generates a signal output in response to the charge potential from the photoelectric converter, and a reset element for discharging the charge potential received at the control region of the amplifier, the improvement comprising:

(a) a charge storage element located between the amplifier and the photoelectric converter that stores the charge potential;

(b) a first transfer gate that controls a transfer of the charge potential from the photoelectric converter to the charge storage element; and (c) a second transfer gate that controls a transfer of the charge potential from the charge storage element to the control region of the amplifier.

2. The solid-state photographic element of claim 1 wherein the photoelectric converter is a buried photodiode comprising a buried region of a first conductive type buried in a semiconductor substrate of a second conductive type and a depletion prevention region of the second conductive type that contacts a surface of the semiconductor substrate and is located between the surface of the semiconductor substrate and the buried region.

3. The solid-state photographic element of claim 2 wherein the second transfer gate is comprised of a metal oxide semiconductor gate located between the amplifier and the charge storage element, and the charge storage element is comprised of a diffusion region of a first conductive type proximate a surface of a semiconductor substrate and is located between the second transfer gate and the photoelectric converter, and the first transfer gate is comprised of a metal oxide semiconductor gate located between the second transfer gate and the photoelectric converter and substantially covers the charge storage element.

4. The solid-state photographic element of claim 1 wherein the amplifier is a junction field effect transistor.

5. The solid-state photographic element of claim 3 wherein the first transfer gate includes a voltage that selects the first transfer gate OFF and the voltage forms an inversion layer on a surface of the charge storage element.

6. A solid-state photographic element having a plurality of pixels and wherein each pixel comprises:

(a) a photoelectric converter;

(b) a first transfer gate in communication with the photoelectric converter;

(c) a charge storage element in communication with the first transfer gate and when the first transfer gate is selected ON, the charge storage element is in communication with the photoelectric converter;

(d) a second transfer gate in communication with the charge storage element; and (e) an amplifier in communication with the second transfer gate and a power source and when the second transfer gate is selected ON the amplifier is in communication with the charge storage element;

(f) wherein incident light generates a plurality of electric potentials in a respective plurality of photoelectric converters of a plurality of pixels and the electric potentials can be simultaneously transferred from the plurality of photoelectric converters to a respective plurality of charge storage elements when the respective plurality of first transfer gates are selected ON and the plurality of electric potentials can be sequentially transferred from the plurality of charge storage elements to a respective plurality of amplifiers when the second transfer gates are sequentially selected ON and the plurality of amplifiers provide a respective plurality of signals corresponding to the plurality of electric potentials generated by the plurality of photoelectric converters.

7. The solid-state photographic element of claim 6 wherein the photoelectric converter is a photodiode.

8. The solid-state photographic element of claim 6 wherein the amplifier is a junction field effect transistor.

9. The solid-state photographic element of claim 6 wherein the solid-state photographic element is fabricated on a semiconductor substrate of a first conductive type having a well of a second conductive type formed therein.

10. The solid-state photographic element of claim 9 wherein the photoelectric converter is a buried photodiode comprising a buried region of the first conductive type buried in the well and a depletion prevention region of the second conductive type that contacts a surface of the semiconductor substrate and is located between the surface of the semiconductor substrate and the buried region.

11. The solid-state photographic element of claim 9 wherein the amplifier is a junction field effect transistor comprising a source region of the second conductive type formed in the well of the semiconductor substrate and a drain region of the second conductive type formed in the well of the semiconductor substrate and a gate region of the first conductive type formed in the well of the semiconductor substrate.

12. The solid-state photographic element of claim 11 wherein the amplifier further comprises a channel region of the second conductive type and the gate region of the first conductive type is formed above and below the channel region of the second conductive type.

13. The solid-state photographic element of claim 9 wherein the charge storage element comprises a storage region of the first conductive type in the well of the semiconductor substrate and the charge storage element is located between the photoelectric converter and the amplifier.

14. The solid-state photographic element of claim 9 wherein the photoelectric converter is a buried photodiode comprising a buried region of a first conductive type buried in the well and a depletion prevention region of the second conductive type that contacts a surface of the semiconductor substrate and is located between the surface of the semiconductor substrate and the buried region and wherein the amplifier is a junction field effect transistor comprising a source region of the second conductive type formed in the well of the semiconductor substrate and a drain region of the second conductive type formed in the well of the semiconductor substrate and a gate region of the first conductive type formed in the well of the semiconductor substrate and wherein the charge storage element comprises a storage region of the first conductive type in the well of the semiconductor substrate and the charge storage element is located between the photoelectric converter and the amplifier.

15. The solid-state photographic element of claim 14 wherein the first transfer gate comprises a gate overlaying the charge storage element and extending toward the photoelectric converter such that the first transfer gate together with the buried region of the photoelectric converter and the storage region of the charge storage element form a metal oxide semiconductor transistor.

16. The solid-state photographic element of claim 14 wherein the second transfer gate comprises a gate located proximate the charge storage element and the amplifier such that the gate together with the storage region of the charge storage element and the gate region of the amplifier form a metal oxide semiconductor transistor.

17. The solid-state photographic element of claim 9 further comprising a reset element comprising a gate located proximate the amplifier and a drain region of the first conductive type and the reset element gate together with the reset element drain region and the gate region of the amplifier form metal oxide semiconductor field effect transistor.

18. A method of shuttering a plurality of pixels of a solid-state photographic element, the pixels each having a photoelectric converter, a charge storage element, a first transfer gate, a second transfer gate and an amplifier, comprising the steps of:

(a) exposing a plurality of photoelectric converters to incident light and generating a respective plurality of charge potentials;

(a) transferring the plurality of charge potentials from the plurality of photoelectric converters to a respective plurality of charge storage elements simultaneously; and (b) transferring the plurality of charge potentials from the plurality of charge storage elements to a respective plurality of amplifiers sequentially to provide a video signal.

19. The method of claim 18 wherein the step of transferring the plurality of charge potentials from the plurality of photoelectric converters to a respective plurality of charge storage elements simultaneously includes selecting ON the plurality of first transfer gates and selecting OFF the plurality of second transfer gates.

20. The method of claim 18 wherein the step transferring the plurality of charge potentials from the plurality of charge storage elements to a respective plurality of amplifiers sequentially includes selecting OFF the plurality of first transfer gates and selecting ON the plurality of second transfer gates in a predetermined sequence.

21. The method of claim 18 further comprising the steps of initializing the plurality of photoelectric converters simultaneously before exposing the plurality of photoelectric converters to incident light.

22. The method of claim 21 wherein the step of initializing the plurality of photoelectric converters comprises simultaneously selecting ON the plurality of first transfer gates during a first time period and then simultaneously selecting OFF the plurality of first transfer gates and selecting ON the plurality of second transfer gates during a second time period and wherein the pixels each include a reset element that is selected ON during the second time period.

23. The method of claim 21 wherein the step on initializing the plurality of photoelectric converters comprises applying a voltage potential to a substrate wherein the photoelectric converter is formed.

24. The method of claim 18 further comprising the steps of initializing the plurality of photoelectric converters prior to exposing the plurality of photoelectric converters to incident for an exposure time period.

* * * * *